INVENTOR.
GERALD BOUCHER
BY Richard S. Seligman
ATTORNEY

INVENTOR.
GERALD BOUCHER

BY Richard J. Seligman

ATTORNEY

United States Patent Office 3,488,429
Patented Jan. 6, 1970

3,488,429

MULTILAYER PRINTED CIRCUITS

Gerald Boucher, 59 Highland St., Hudson, N.H. 03057

Continuation of application Ser. No. 637,984, May 12, 1967, which is a division of application Ser. No. 277,646, May 2, 1963. This application Feb. 24, 1969, Ser. No. 802,757

Int. Cl. H05k *1/02*

U.S. Cl. 174—68.5 5 Claims

ABSTRACT OF THE DISCLOSURE

A printed circuit board is provided having a desired circuit on each side of an insulating layer with interconnections between the circuits being molecularly united thereto. Portions of the desired circuits extend through the insulating layer to be molecularly united with portions of the circuit on the reverse side thereof. The concept is also applicable to multilayer boards having more than two circuit layers.

This application is a continuation of Ser. No. 637,984 filed May 12, 1967, now abandoned, which is a division of my co-pending application Ser. No. 277,646, filed May 2, 1963 and entitled "Printed Circuits and Methods for Producing Same, issued on Mar. 19, 1968 as Patent No. 3,374,129."

According to conventional practice, the manufacture of a printed circuit board starts with what is called laminate, usually an insulating board of so-called epoxy glass, approximately 1/16 inch thick, to one or both sides of which is cemented a layer of copper foil so thin as to be incapable of self-support, usually only a few thousandths of an inch thick. The foil is then coated with a light-sensitive resist, and exposed through a film negative of the circuit to be produced. After development, the unexposed resist is removed, and the copper etched away except where it is covered by the exposed resist. After etching, the exposed resist is removed.

In planning and utilizing printed circuits, it has frequently been necessary when using conventional techniques, to use a number of circuit boards to carry and interconnect all the circuit components to be employed. This has usualy been done by employing both sides of the board, and interconnecting the desired points on opposite sides of the board by the insertion of metal eyelets.

If still another surface is required, an additional board has been used, and interconnections made by connectors and lead wires. Sometimes the boards have been pressed together, and connections have been made by drilling holes through the pressed-together boards and plating through the holes to form the interconnections. These known methods are in many cases unsatisfactory, because of the relatviely high failure rate of the interconnections between layers of printed circuit boards, and the expense and inefficient use of board space, particularly where space and/or weight are critical.

In practicing my invention, I provide lands on the etched inner surface of one circuit layer which are molecularly united, as will be described hereinafter, to points on another layer. I start with a copper sheet of the order of 0.007" thick, which is coated with light-sensitive resist. A negative film mask of the desired lands is placed over the resist-coated sheet and exposed. The image is developed, the unexposed resist removed, and the sheet is partly, but not completely, etched, leaving the lowest conductor layer having the desired lands as a raised pattern on the etched side. Epoxy insulation is then applied to the etched face of the copper, and the epoxy is cleaned away, down to the level of the lands.

The piece is then immersed in a catalyst, and then in an electroless copper plating bath, which deposits a copper film over the entire surface of copper and epoxy. The piece is then electroplated with copper to form a second layer of copper over the first copper and epoxy coating. The new copper surface is then coated with light-sensitive resist, and exposed through a film negative of the circuit pattern of the second circuit layer. This second image is developed, the unexposed resist removed, and the piece is again etched through to the epoxy insulation, leaving the second layer image as a raised conductor pattern, molecularly united to the lands on the copper sheet.

If desired, a third layer of epoxy is applied to seal the top surface. The metal surface on the under side of the starting sheet is now coated with light-sensitive resist and exposed through a film mask to produce the bottom layer circuit image, the image developed, and the bottom surface etched. Circuit components may be mounted on the bottom surface, and soldered or welded to the metal, or formed as part of the circuit pattern. Inductors and capacitors may be formed as part of the circuit pattern by etching, and resistors may be formed with resistance paint or compounds on any circuit layer. In addition, micro-miniature circuits such as flip-flops, etc., may be applied to the top, bottom, or intermediate circuit pattern layers.

From the foregoing, it will be understood that among the objects of my invention are the following:

To provide an improved form of multilayer printed circuit which is relatively free from the defects and difficulties heretofore characteristic of such circuits;

To provide an improved technique for producing such circuits;

To provide a multilayer printed circuit in which there is provided improved and reliable contact between the various layers of circuitry at points where contacts between layers are desired;

To provide multilayer printed circuitry and techniques for producing them, which provide such circuits of greatly improved reliability and ruggedness under operating conditions and which techniques are more economical and more flexible than heretofore;

To provide a multilayer printed circuit which results in a monolithic assembly in which leads and interconnections are a single unit;

To provide a multilayer printed circuit in which the use of soldered joints or external detachable connectors between various layers is eliminated.

Still other objects and advantages of my invention will be apparent from the following specification.

The features of novelty which I believe to be characteristic of my invention are set forth with particularly in the appended claims. My invention itself, however, both as to its fundamental principles and as to its particular embodiments, will best be understood by reference to the specification and accompanying drawing, in which FIGS. 1*a*, 1*b*, 1*c*, 1*d*, 1*e*, 1*f* and 1*g* are perspective views of a multilayer printed circuit in various stages of manufacture;

Figure 3:
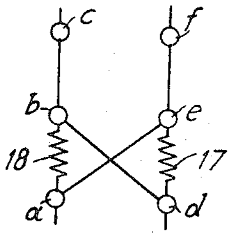
FIG. 3 is a schematic circuit diagram of the circuit of FIG. 1*g*.

It will be understood that the relatively simple circuit shown in FIG. 3 would not ordinarily require a multilayer laminate, but this simple circuit is used only for illustrative purposes, to demonstrate the principles of my invention.

In contrast to conventional practice, I start (FIG. 4, step 1) with a copper sheet somewhat thicker, preferably 0.007 inch thick, which can be handled, coated with resist, exposed and etched without being mounted on an insulating board. In case a weldable surface layer is desired in my printed circuit, I may start with a sheet of 0.0025 inch thick nickel, having one side plated with 0.0045 inch of copper. The size of the starting sheet is preferably somewhat larger than the finished dimensions, say ½ inch.

The sheet is then thoroughly cleaned (step 2) by scrubbing with "White Dot" scrubbing compound, obtainable from Etchomatic Inc., Waltham, Mass., or the equivalent, using a brass bristled brush with water, and spray rinsed thoroughly with water, and the surface dried immediately with filtered compressed air (step 3). All traces of the scrubbing compound must be removed for best results, so that the cleaned surface will hold a thin, unbroken skin of water.

The cleaned surface is then dipped or flow coated (step 4) with Kodak Photo Resist or the equivalent. It is then allowed to dry in a vertical position for about 20 minutes (until no tackiness remains). The dried coating is light sensitive, and if the coated plates are to be stored, they should be stored in the dark.

Next, the negative film mask of the lands to be produced is aligned with the cleaned and resist-coated copper in a vacuum or pressure printing frame, and exposed (step 5) with an ultraviolet light source for about 30,000 foot candle minutes. This exposure may be varied somewhat under particular conditions for best results.

The image is then developed (step 6) by dipping in Kodak Photo Resist developer, or the equivalent, for two or three minutes, and flush rinsed with methyl ethyl ketone (MEK) or the equivalent, to remove the unexposed resist, and allowed to dry for about two minutes at room temperature. The image may be dyed, if desired, by dipping into Kodak Photo Resist dye or the equivalent, for about 30 seconds. Any excess dye is flushed off with water spray, and the piece dried with compressed air. The piece should then be inspected and any flaws in the exposed resist image touched up with lacquer or dope using an artist's brush.

The work is now ready for etching, which is preferably done in a tank containing cupric chloride etchant or the equivalent. Etching is continued to a total depth of 0.004 to 0.0045 inch, turning the piece 180° at 2 minute intervals. This will ordinarily require about 10 minutes. After etching, the piece is flushed clean with water and allowed to dry (step 7).

The exposed photoresist is then removed (step 8) by dipping the piece into a solution of Stripper 77 obtainable from Shipley Co., Wellesley, Massachusetts, or the equivalent, for two to three minutes. It is then spray rinsed thoroughly, and dried. Care should be taken to be sure that all resist has been removed.

The surface of the workpiece is then prepared for laminating to an insulation layer made of material such as epoxy glass cloth, "Teflon" glass cloth, (tetrafluoroethylne fluorocarbon resin), or any other suitable insulating material. Any one of several methods can be used to prepare the surface of the work piece for bonding insulation thereto. Examples of these are as follows:

The piece can be dipped in a 2 lb./gallon solution of "Ebonol," obtainable from Enthone Corp., New Haven, Conn., or the equivalent, at 95° C. (200° F.) for 10 minutes, then spray rinsed and dried (step 9). "Ebonol" is 50% sodium chlorate and 50% sodium hydroxide, and converts the copper surface to black copper oxide.

Figure 4:
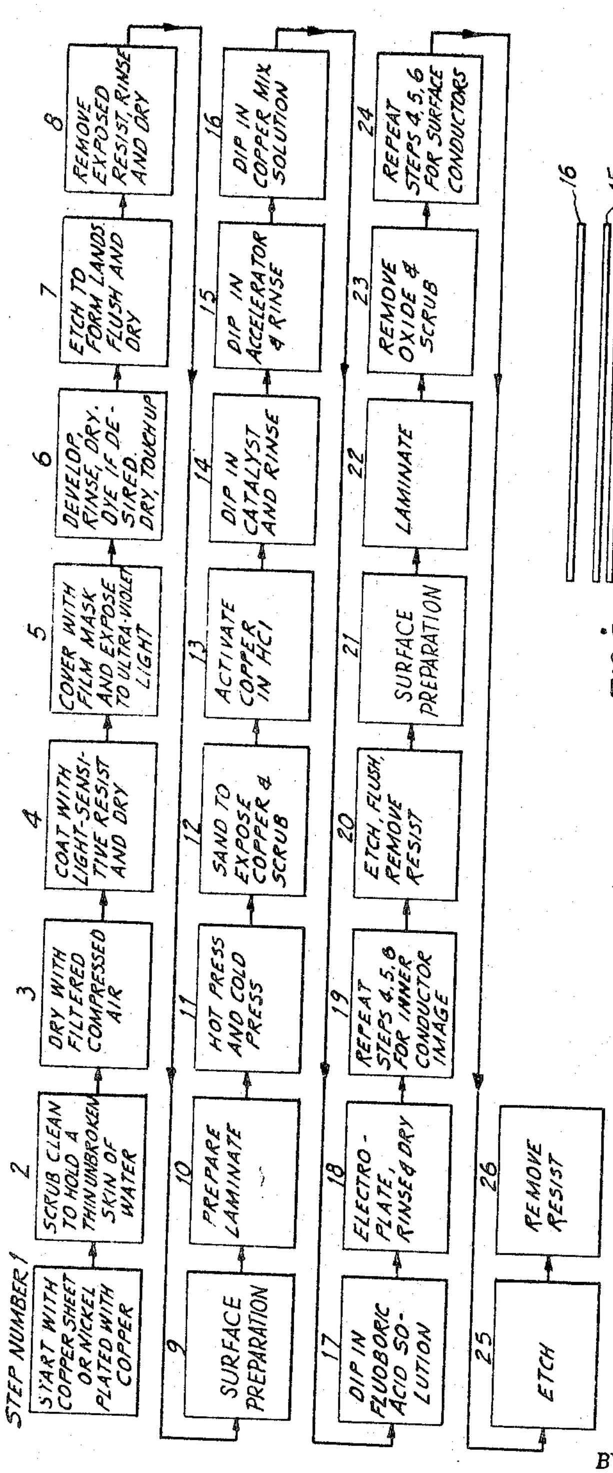
FIG. 4 is a flow diagram of the process used in fabricating a multilayer printed circuit according to my invention.

Another method is to clean the surface of the piece with an abrasive such as pumice or as described in step 2 of FIG. 4.

A third method is to lightly etch the surface with a chemical solution, cupric chloride or any other etching solution which leaves comparatively a rough surface.

Figure 1A:
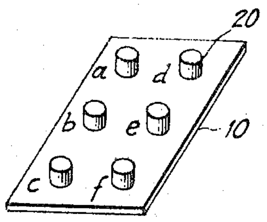

Of course the work piece must be washed and dried after each of the above set forth steps. The piece then has the appearance shown in FIG. 1*a*, the partly etched copper sheet 10 having the lands *a*, *b*, *c*, *d*, *e* and *f* projecting upwardly as a result of the etching.

Figure 5:
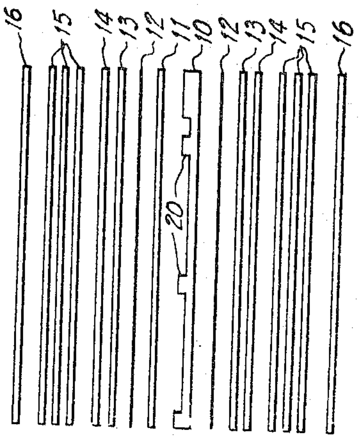
FIG. 5 is an exploded side view of a partly etched sheet assembly ready for the laminating step.

The piece is now ready to be laminated (mounted with its etched side against a sheet of epoxy glass). As shown in FIG. 5, I prefer to use a sheet 11 of 112V–E730 "B" staged epoxy glass or the equivalent, and release sheets 12 of 0.001 inch "Teflon" (tetrafluoroethlyne fluorocarbon resin) are placed over and under the etched metal and epoxy sandwich. Above and below the release sheets 12, I place 1/16″ stainless steel caul plates 13, next 1/16″ "Teflon" glass pads 14, and above and under the pads 14 three pads 15 of heavy kraft paper. The top and bottom of the press assembly are formed by 1/16″ silicon glass carrier plates 16.

With the press temperature set at 325° F., the assembly is inserted and a pressure of 200 p.s.i. applied for 4 to 5 minutes, then the pressure is increased to 500 p.s.i. and held for 20 minutes to cure. The assembly is then transferred to a cold press and cooled for 10 minutes, or until it is cool enough to handle (step 11). Sheets 12–16 are then removed, leaving the etched piece 10 and the epoxy glass 11 bonded together over the etched surface.

As an alternative process to laminating the insulation layer as described above and as shown in step 11 in FIG. 4, any suitable adhesive can be used to bond the insulation layer to the etched copper conductors to any of the aforesaid type of surface treatments such as "Ebonol" solution, cleaning, lightly etching or etching and electroplating with suitable current densities.

Figure 1B:
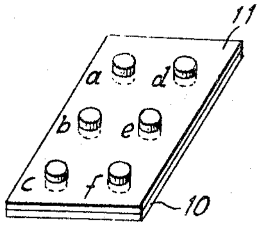

The assembly is then sanded on the etched side to remove the excess epoxy and leave the copper lands 20 exposed and clean, as shown in FIG. 1*b*. For this I prefer to use 180 grit emery cloth and sand with cross strokes (step 12). The piece is then scrubbed as described in step 2. The copper is then activated by a 30 second dip in a 25% solution of HCl (step 13).

The piece is then dipped into catalyst 6F, obtainable from Shipley Co., Wellesley, Mass., or the equivalent, using the catalyst full strength for 4 minutes, at room temperature (step 14). After removal from the catalyst, the piece is flush rinsed thoroughly, but not dried. It is then dipped into a solution of Accelerator 19, obtainable from Shipley Co., Wellesley, Mass., or the equivalent, made from 1 part accelerator to 3 parts water (step 15). The dip is for 2 minutes at room temperature, and the piece is flush rinsed, but not dried.

The work is then dipped into electroless copper mix solution 328 obtainable from Shipley Co., Wellesley, Mass., or the equivalent, mixed 1 part 328A and 1 part 328B to 8 parts distilled water at 85° F., agitated gently for 20–25 minutes, and flow rinsed in running water, but not dried (step 16). The piece is then dipped into a 20% fluoboric acid solution or the equivalent for 30 seconds (step 17), and transferred directly into the plating bath. Fluoboric acid (reagent grade) is obtainable from J. T. Baker Chemical, Phillipsburg, Pa.

Figure 1C:
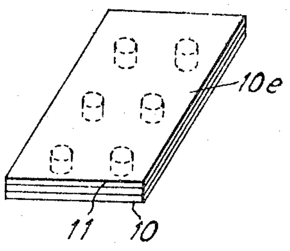

The piece is then electroplated in a bath of cupric fluoborate or the equivalent, obtainable from Allied Chemical, New York (step 18). The bath is operated as follows: Temperature 110° F., pH .4 to .5, 50% concentrate and 50% water mixture; started with a current density of .1 amp/in.$^2$, and gradually increased to 1 amp/in.$^2$, and plated to a thickness of 0.0015″ of copper. Time required is approximately 12 minutes. After plating, the piece is spray rinsed and dried with compressed air, and appears as in FIG. 1*c*, the electroplated cover layer being shown as 10*e*.

Figure 1D:
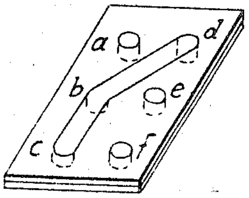

The work is now ready for the formation of another circuit layer. The upper surface is coated with resist, exposed through the second circuit negative film mask, exposed, the image developed, the unexposed resist removed, and the layer 10*e* etched in cupric chloride etchant as before (step 20). The piece then has the appearance shown in FIG. 1*d*, with a layer of copper connecting lands *c*, *b* and *d*. Because of the lesser thickness of layer 10*e*, a shorter etch time is sufficient; in this case, about 4 minutes. After etching, the new conductor layer is flushed with water, and the exposed resist removed as before, and the new layer dipped in "Ebonol" as with the first layer (step 21).

Figure 1E:
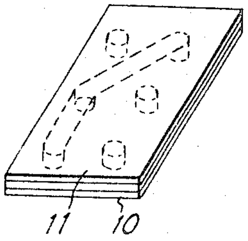

One or more layers of epoxy glass 112V–E730 are then bonded to the upper surface, using one layer of epoxy glass for every .004" thickness desired, employing the steps previously described for laminating. The piece now appears as in FIG. 1*e*.

Figure 1F:
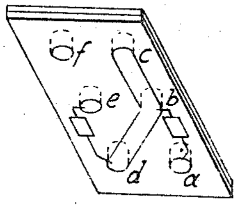
Figure 1G:
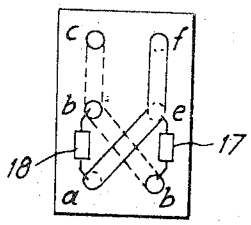

The lower surface of partly etched copper sheet 10 is now ready for the formation of the lowest circuit layer. The piece is dipped into cupric chloride etchant to remove the oxide, then scrubbed clean (step 23) as in step 2. The cleaned bottom surface (turned over as in FIG. 1*f*) is then coated with light-sensitive resist, exposed through a negative film mask for the lower surface circuit, the image developed, unexposed resist removed (step 24) as in steps 4, 5 and 6, and the lower surface etched (step 25) as in step 7. The exposed resist is then removed (step 26) and the board is ready for assembly (attachment of other desired circuit components).

Figure 2:
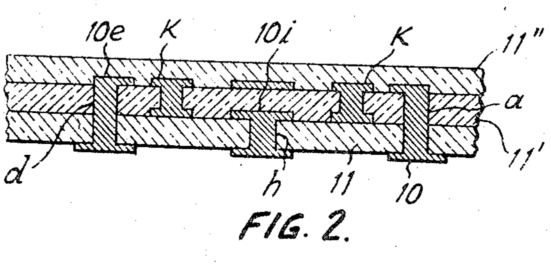
FIG. 2 is a fragmentary section through a completed printed circuit of my invention, somewhat enlarged for clarity.

The embodiment of my invention herein described with reference to FIG. 4 is a multilayer printed circuit having three circuit layers, bottom, top, and inner as shown in FIG. 2, but a two-layer board may be made as FIGS. 1*a*–1*g*, or more than three circuit layers may be provided if desired by following the principles explained.

Referring more particularly to FIG. 2 in which a three-layer board is shown, 10 designates the bottom layer of conductor having a circuit on its bottom surface and its upper surface having the upwardly projecting lands *a* and *d* which are molecularly united with the top circuit **10*e***, and by the land *h* with the inner circuit **10*i*. 11 designates a layer of epoxy glass separating lower layer 10 from inner layer 10*i*, and 11' is another layer of epoxy glass separating inner circuit 10*i* from top circuit 10*e***, except where molecularly united to the top circuit by lands *k*.

If desired, the circuit board herein described may be bonded to a metal carrier which may be aluminum, anodized if desired, to protect against corrosion, copper, stainless steel, etc., or plastic such as epoxy glass. The bond to the carrier may be epoxy resins reinforced with glass or other fibers.

The term "molecularly united," as used herein, means a junction between different layers of circuits achieved by depositing a metallic conductor on another metallic conductor of the same or similar metal to form a unitary conducting path between said layers so that the junction is electrically and mechanically indistinguishable. The term does not include eyelet or solder connections, or connections by contacts, lead wires, or the like, nor does it include holes drilled through the insulation, the interior surface of which is plated.

The term "plated on" means the chemical and/or electro-chemical deposition of a conductor, but does not include mechanical fastening, such as by cementing or the like.

The term "multilayer" means more than one layer, including two, three, or more.

In the foregoing, I have described certain preferred forms and methods of practicing my invention, and the best mode presently contemplated by me for carrying it out, but it will be understood that modifications and changes may be made without departing from the spirit and scope thereof.

I claim:

1. The new article of manufacture comprising a multilayer printed circuit board having a first etched circuit with at least one solid projecting land formed on one side thereof, said projecting land being formed integrally with said first circuit and having a homogeneous grain structure with said first circuit at the junction thereof; a layer of insulation having at least one hole therein and with one side of said layer of insulation in juxtaposition to said first circuit, said projecting land of said first circuit filling said hole; and a second etched circuit in juxtaposition to the other side of said layer of insulation and being molecularly united to said projecting land.

2. The new article of manufacture claimed in claim 1, said insulation layer being impervious to moisture.

3. The new article of manufacture claimed in claim 1, said first circuit and said projecting land having a unitary grain structure throughout.

4. The new article of manufacture claimed in claim 1, said multilayer printed circuit board being flexible and having a flexible insulating layer.

5. The new article of manufacture claimed in claim 1, said second circuit including at least one projecting solid land, and further including a second layer of insulation in juxtaposition to said second circuit and having at least one hole therein, said projecting land of said second circuit filling the hole of said second layer of insulation; and a third etched circuit in juxtaposition to said second layer of insulation and being molecularly united to the projecting land of said second circuit.

References Cited

UNITED STATES PATENTS

| | | | |
|---|---|---|---|
| 2,981,868 | 4/1961 | Severson | 174—68.5 XR |
| 3,171,756 | 3/1965 | Marshall | 174—68.5 XR |
| 3,217,089 | 5/1965 | Beck | 174—68.5 |
| 3,350,498 | 10/1967 | Leeds | 174—68.5 |
| 3,352,730 | 11/1967 | Murch | 174—68.5 XR |
| 2,721,822 | 10/1955 | Pritikin. | |
| 3,040,213 | 7/1962 | Byer et al. | |

FOREIGN PATENTS 1,345,163 10/1963 France.

OTHER REFERENCES

Klippel, "Method of Producing Three Dimensional Printed Circuits," IBM Technical Disclosure Bulletin, vol. 2, No. 4, December 1959, p. 7.

"Printed Assemblies," publ. in Tele-Tech & Electronics Industries, December 1954, p. 101.

DARRELL L. CLAY, Primary Examiner

U.S. Cl. X.R.

29—625; 317—101; 339—17